United States Patent
Fujii

(10) Patent No.: US 6,919,586 B2
(45) Date of Patent: Jul. 19, 2005

(54) SIDE-EMISSION TYPE SEMICONDUCTOR LIGHT-EMITTING DEVICE AND MANUFACTURING METHOD THEREOF

(75) Inventor: Takehiro Fujii, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/792,200

(22) Filed: Mar. 1, 2004

(65) Prior Publication Data

US 2004/0169187 A1 Sep. 2, 2004

Related U.S. Application Data

(62) Division of application No. 10/019,508, filed on Apr. 11, 2002, now abandoned.

(30) Foreign Application Priority Data

| Apr. 24, 2000 | (JP) | ........................................ | 2000-122255 |
| May 8, 2000 | (JP) | ........................................ | 2000-134159 |
| May 24, 2000 | (JP) | ........................................ | 2000-152249 |

(51) Int. Cl.$^7$ ............................................... H01L 33/00
(52) U.S. Cl. ........................... 257/100; 257/99; 257/81
(58) Field of Search .......................... 257/81, 79, 99, 257/98, 100

(56) References Cited

U.S. PATENT DOCUMENTS 6,483,623 B1 * 11/2002 Maruyama .................. 398/182
2002/0057056 A1 * 5/2002 Okazaki ..................... 313/512

* cited by examiner

*Primary Examiner*—Brad Smith
(74) *Attorney, Agent, or Firm*—Gerald T. Bodner

(57) ABSTRACT

A side-emission type semiconductor light-emitting device 10 includes a substrate 12, and the substrate 12 is provided with a case 14 formed of a resin having opacity and reflectivity. The substrate 12 is formed, on its surface, with electrodes 18a and 18b onto which an LED chip 20 is bonded. A transparent or translucent resin 16 is charged between the substrate 12 and the case 14 whereby the LED chip 20 is molded. A light-emitting surface of the side-emission type semiconductor light-emitting device 10 includes surfaces 16a, 16b and a surface opposite to the surface 16b which are formed of the transparent or translucent resin 16. Furthermore, the light-emitting surface is formed by a roughened surface. Due to this, a light outputted from the LED chip and a light reflected from the case 14 is scattered by the light-emitting surface.

6 Claims, 17 Drawing Sheets

LIGHT-EMITTING
DIRECTION P

LIGHT-EMITTING
DIRECTION P

US 6,919,586 B2

1

SIDE-EMISSION TYPE SEMICONDUCTOR LIGHT-EMITTING DEVICE AND MANUFACTURING METHOD THEREOF

CROSS-REFERENCE TO RELATED APPLICATIONS

This application is a division of U.S. application Ser. No. 10/019,508, filed on Apr. 11, 2002, now abandoned, and entitled, "Side-Emission type Semiconductor Light-Emitting Device and Manufacturing Method Thereof", the disclosure of which is incorporated herein by reference.

TECHNICAL FIELD

The present invention relates to a side-emission type semiconductor light-emitting device and a manufacturing method thereof. More specifically, the present invention relates to a side-emission type semiconductor light-emitting device in which an LED chip is bonded onto an electrode on a substrate, and a manufacturing method thereof.

PRIOR ART

An example of this kind of a conventional side-emission type semiconductor light-emitting device and a manufacturing method thereof is disclosed in a Japanese Patent Laying-open No.5-315651 (H01L 33/00) laid-open on Nov. 26, 1993. A side-emission type semiconductor light-emitting device 1 manufactured in the disclosed manufacturing method is shown in FIG. 17(A). According to FIG. 17(A), an LED chip 43 is bonded onto electrodes 42a and 42b formed on a substrate 42. A transparent or translucent synthetic resin 44 is formed so as to cover the LED chip 43. As can be understood from FIG. 17(B) of a cross-sectional view at a line XVIB—XVIB in FIG. 17(A), the transparent or translucent synthetic resin 44 has a smooth upper surface and a bulge toward a light-emitting surface 45. Furthermore, a cover body 46 having a concave portion into which the transparent or translucent synthetic resin 44 is fitted is formed so as to cover the transparent or translucent synthetic resin 44. The cover body 46 is formed of a resin having opacity and reflectivity, and a light emitted from the LED chip 43 to the direction different from the light-emitting surface 45 is reflected by the cover body 46. Accordingly, the reflected light is also outputted from the light-emitting surface 45, and a light-emitting efficiency in the side surface direction is thus improved.

However, since in the above-described prior art a gold wire (bonding wire) 43a for electrically connecting between the LED chip 43 and the electrode 42b is bonded in a vertical direction with respect to the light-emitting surface 45, a length W in a width direction of the semiconductor light-emitting device 1 is shorter than a length D in a depth direction thereof. Furthermore, the light-emitting surface 45 is formed on only a part of one side surface of the semiconductor light-emitting device 1 and therefore a light-emitting area becomes narrow. Due to this, when the semiconductor light-emitting device 1 is utilized as a backlight for a liquid crystal display (LCD) of electrical equipment such as a mobile phone and etc., there is a need to prevent an occurrence of a so-called dark portion by providing a relatively large number of semiconductor light-emitting devices 1 on a light guide plate.

For avoiding this, the applicant of the present invention has proposed a chip-type light-emitting device 51 as shown in FIG. 18(A) in a previous patent application No. 11-124410, i.e. Japanese Patent Laying-open No.2000-

2

315825 laid-open on Nov. 14, 2000. According to FIG. 18(A), a substrate 53 is formed with electrodes 53a and 53b, and an LED chip 55 is bonded onto the electrodes 53a and 53b. In other words, as can be understood from FIG. 18(B) of a cross-sectional view at a line XVIIB—XVIIB in FIG. 18(A), the LED chip 55 is die-bonded onto the electrode 53a by a bonding paste (hereinafter referred merely to as "DB paste") 61 and is wire-bonded onto the electrode 53b by a bonding wire 55a. A reflector (case) 57 formed of a resin having opacity and reflectivity is provided on the substrate 53 so as to enclose the LED chip 55, and an opening portion formed by the substrate 53 and the case 57 is filled with a transparent or translucent resin 59.

As can be understood from FIG. 18(B), the bonding wire 55a is bonded in approximately parallel to a width direction of the chip-type semiconductor light-emitting device 51, whereby a light-emitting surface is made larger. It is noted that in FIG. 18(A), surfaces 59a and 59b and a surface opposite to the surface 59b which are formed of the transparent or/translucent resin 59 shall be the light-emitting surface. However, although the chip-type semiconductor light-emitting device 51 can make the light-emitting surface larger, a mirror finish of the surface 59a makes it difficult to manufacture the light-emitting device.

More specifically, when manufacturing the chip-type semiconductor light-emitting device 51, a successive substrate 61 successively formed with the substrates 53 and a successive case 63 successively formed with the cases 57 are utilized so as to manufacture about a thousand of chip-type semiconductor light-emitting devices at a time. First, the successive substrate 61 and the successive case 63 are adhered to each other, a cross section is shown in FIG. 19(A). In FIGS. 19(A) to 19(c), although the successive substrate 61 is shown so as to extend only in a lateral direction, the successive substrate 61 also extends in a direction perpendicular to the paper sheet. Meanwhile, members 63a included in the successive case 63 are formed with predetermined intervals in a lateral direction, and a cross section of the member 63a is formed in a T-character form. Furthermore, the successive case 63 extends in a direction perpendicular to the paper sheet similarly to the successive substrate 61. In other words, the member 63a is formed in a stick form so that a cross section thereof becomes a T-character form. It is noted that the members 63a are connected to each other at an end portion not shown, and the successive case 63 is thus formed.

After the successive substrate 61 and the successive case 63 are adhered to each other, a metal mold 71 is attached thereto as shown in FIG. 19(B), and the transparent or translucent resin 59 is, in turn, injected as shown in FIG. 19(C). When the transparent or translucent resin 59 is hardened, the metal mold 71 is detached, and then, dicing is performed at a portion shown by a dotted line in FIG. 19(C). Meanwhile, dicing is performed at every width of the device in a direction parallel to the paper sheet. Thus, a plurality of chip-type semiconductor light-emitting devices 51 can be obtained. The surface 59a forming the light emitting surface is subjected to a mirror finish by a metal surface of a convex portion 71a of the metal mold 71.

However, since there is a need to fit the convex portion 71a of the metal mold 71 into a space 73 of approximately 0.3 to 0.5 mm between respective members 63a, it makes difficult to position the metal mold 71. Furthermore, the convex portion 71a is so thin that it is liable to be damaged. In addition, the metal mold 71 needs to be removed after the transparent or translucent resin 59 is hardened, and a friction makes it difficult to pull out the metal mold 71. Since the surface 19a shown in FIG. 18(A) is subjected to the mirror finish, the light outputted form the LED chip 55 is refracted therefrom, and alight-emitting intensity in the side surface direction is thus decreased.

Furthermore, as can be understood from FIGS. 18(A) and 18(B), because the case 57 has a small area to be brought into contact with the substrate 53, and they are formed of different materials, it causes a decrease in adhesion between the case 57 and the transparent or translucent resin 59. Due to this, the case 57 can be separated by external shock with ease. In addition, since the LED chip 55 is die-bonded onto the electrode 53a by the DB paste 61, the lower part (base) of the LED chip 55 is covered by the DB paste 61. Therefore, the light outputted from the base portion of the LED chip 55 is blocked by the DB paste 61, and a light-emitting efficiency is thus decreased.

SUMMARY OF THE INVENTION

Therefore, it is a primary object of the present invention to provide a side-emission type semiconductor light-emitting device capable of improving a light-emitting intensity, and a manufacturing method thereof.

It is another object of the present invention to provide a side-emission type semiconductor light-emitting device capable of preventing a case from being separated, and a manufacturing method thereof.

It is another object of the present invention to provide a side-emission type semiconductor light-emitting device capable of improving a light-emitting efficiency in a desired light-emitting direction.

A side-emission type semiconductor light-emitting device according to the present invention comprises: a substrate formed with an electrode; an LED chip bonded onto the electrode; and a transparent or translucent resin with which the LED chip is molded, wherein the transparent or translucent resin has a light-emitting surface formed by a roughened surface being perpendicular to the substrate. Forming the light-emitting surface perpendicular to the substrate by a roughened surface, a light outputted by the LED chip is scattered by the light-emitting surface, whereby light-emitting intensity is improved. It is preferable dicing is utilized to form the light-emitting surface.

A manufacturing method of a side-emission type semiconductor light-emitting device according to the present invention comprises the following steps of: (a) mounting two reflectors having openings opposed with each other on a substrate mounted with an LED chip; (b) injecting a transparent or translucent resin at an opposing portion of the openings; and (c) dicing the transparent or translucent resin being hardened and the substrate at the opposing portion. In the side-emission type semiconductor light-emitting device manufactured, a dicing surface of the transparent or translucent resin shall be a light-emitting surface. Dicing makes the light-emitting surface a roughened surface, whereby a light outputted from the LED chip is scattered from the light-emitting surface. Due to this, the light-emitting intensity is improved.

A side-emission type semiconductor light-emitting device according to the present invention comprises: a substrate formed with an electrode; an LED chip bonded onto the substrate; a transparent or translucent resin with which the LED chip is molded; and a reflector which reflects a light emitted from the LED chip, wherein the transparent or translucent resin has a convex portion, and the reflector has a concave portion to be fitted into the convex portion. By fitting the convex portion into the concave portion, the transparent or translucent resin and the reflector are integrated to each other, and the reflector is thus never separated with ease.

If the concave portion is made as a throughole becoming larger from one main surface to other main surface of the reflector, even if an external force from the one main surface to the other main surface is applied to the reflector, the reflector is not easily fallen. Preferably, the one main surface is a surface brought into contact with the transparent or translucent resin, and the other main surface is a surface exposed to the outside. In a case the LED chip has a bonding wire extending from an upper surface of the chip, by forming the concave portion directly above the LED chip, the bonding wire can be housed in the concave portion, and therefore, it is possible to restrain the height of the side-emission type semiconductor light-emitting device.

A manufacturing method of a side-emission type semiconductor light-emitting device according to the present invention comprises the following steps of: (a) mounting a reflector formed with a concave portion on a substrate; (b) removing an organic matter adhering on a surface, including an inner surface of the concave portion, of the reflector; and (c) injecting a transparent or translucent resin between the reflector and the substrate up to the concave portion. By removing the organic matter, the transparent or translucent resin is easily entered into the concave portion, and adhesion between the reflector and the transparent or translucent resin is thus increased. By integrating the reflector with the transparent or translucent resin, it is possible to prevent the detachment of the reflector. It is preferable that a UV cleaning is utilized to remove the organic matter.

A side-emission type semiconductor light-emitting device according to the present invention comprises: a substrate formed with an electrode; and an LED chip bonded onto the electrode by a bonding paste, wherein the LED chip has a transparent or translucent base and a light-emitting layer formed thereon, and is mounted at a position deviated from an application position of the bonding paste to a light emitting surface side. A light outputted from the light-emitting layer is outputted from the light-emitting surface through the transparent or translucent base. Since the LED chip is bonded onto the position deviated from the application position of the bonding paste to the light-emitting surface side, the base is not covered by the bonding paste, and a light-emitting efficiency is thus improved.

It is preferable that the electrode includes an application area having a center deviated from a mounted position of the LED chip to an opposite direction of the light-emitting surface, whereby it is possible to determine the application position of the bonding paste with ease. More preferably, the electrode includes an auxiliary area formed closer to the light-emitting surface side than the application area and a narrow connecting portion connecting the application area and the auxiliary area. By forming the auxiliary area, the LED chip is securely bonded onto the electrode. Furthermore, by connecting the application area and the auxiliary area with the narrow connecting portion, the bonding paste applied to the application area never enters the auxiliary are with ease. If the center of the application area is deviated from the center of the substrate to the opposite direction, the mounted position of the LED chip can be made at the same position as conventional position.

The above described objects and other objects, features, aspects and advantages of the present invention will become more apparent from the following detailed description of the present invention when taken in conjunction with the accompanying drawings.

BEST FORM FOR PRACTICING THE INVENTION

Figure 1:
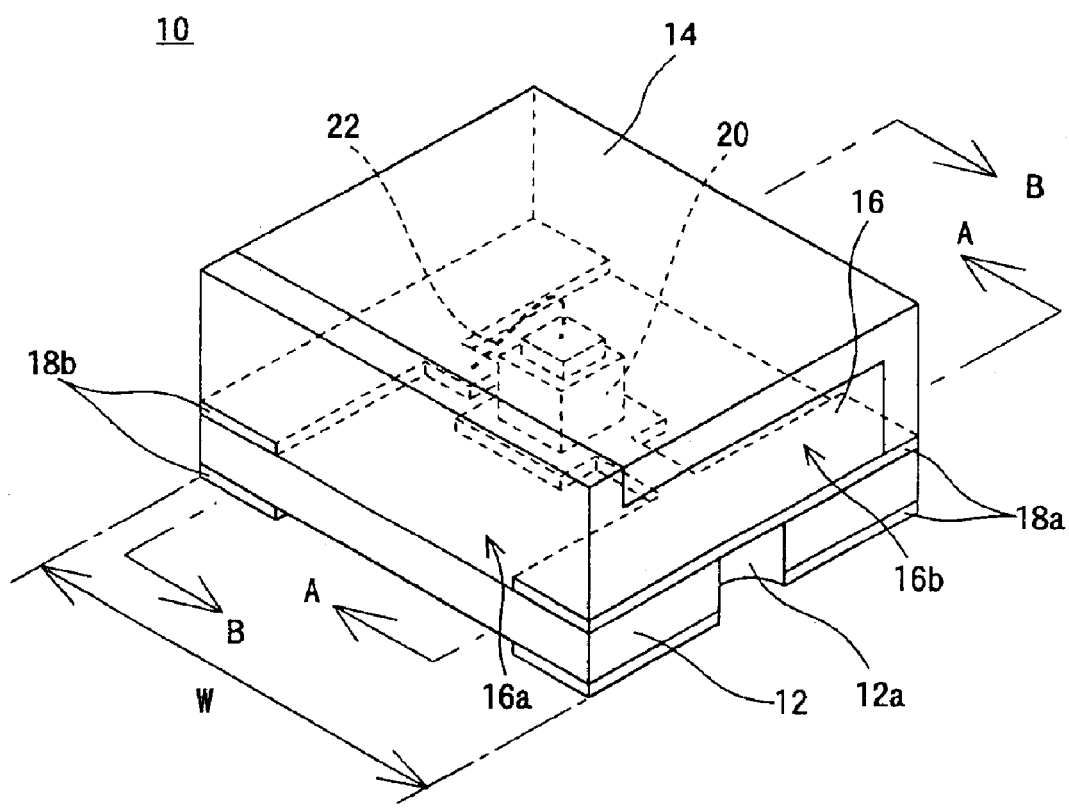
FIG. 1 is an illustrative view showing one embodiment of the present invention.

Referring to FIG. 1, a side-emission type semiconductor light-emitting device (hereinafter referred merely to as "light-emitting device") 10 of this embodiment includes an insulating substrate (hereinafter referred merely to as "substrate") 12 formed of a glass epoxy or the like. On the substrate 12, a reflector (case) 14 formed of a resin having opacity and reflectivity is provided. The substrate 12 is provided with electrodes 18a and 18b, and as can be understood from FIG. 2(A) of cross-sectional view at a line IIA—IIA in FIG. 1, a semiconductor light-emitting element (LED chip) 20 is die-bonded onto the electrode 18a by a DB paste (not shown). Meanwhile, as can be understood from FIG. 2(B) of a cross-sectional view at a line IIB—IIB in FIG. 1, the electrode 18b and the LED chip 20 are electrically connected with each other by a bonding wire 22 such as a gold wire and etc.

The electrode 18a is formed to extend from a front side to a backside of the substrate 12 via a throughhole 12a provided on a side surface of the substrate, and is structured to be directly mounted on the printed board (not shown) so as to be electrically connected thereto. Although not illustrated, the electrode 18b is structured in the same or similar manner. A space between the substrate 12 and the case 14 is charged or filled with a transparent or translucent resin 16 such as an epoxy resin or the like with which the LED chip 20 is molded.

Figure 2A:
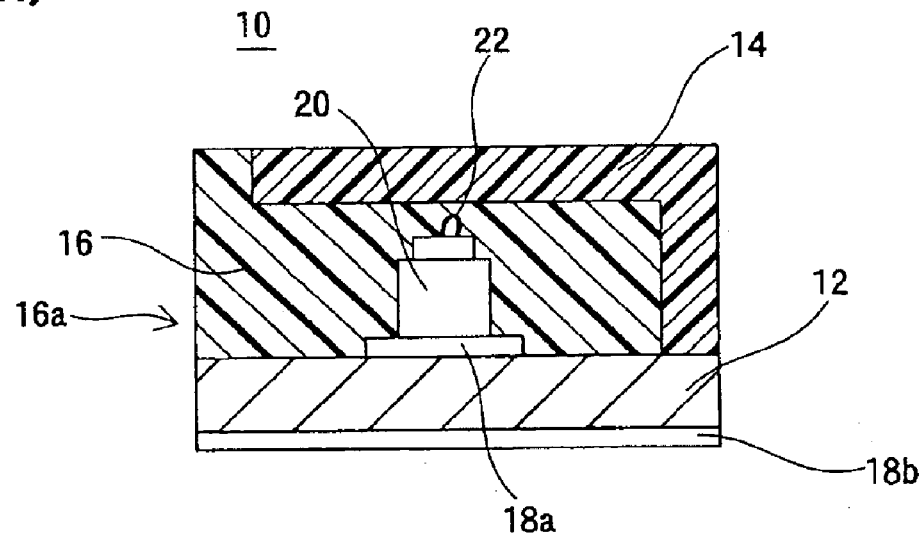
FIG. 2(A) is a cross-sectional view of a light-emitting device at a line IIA—IIA shown in FIG. 1.
Figure 2B:
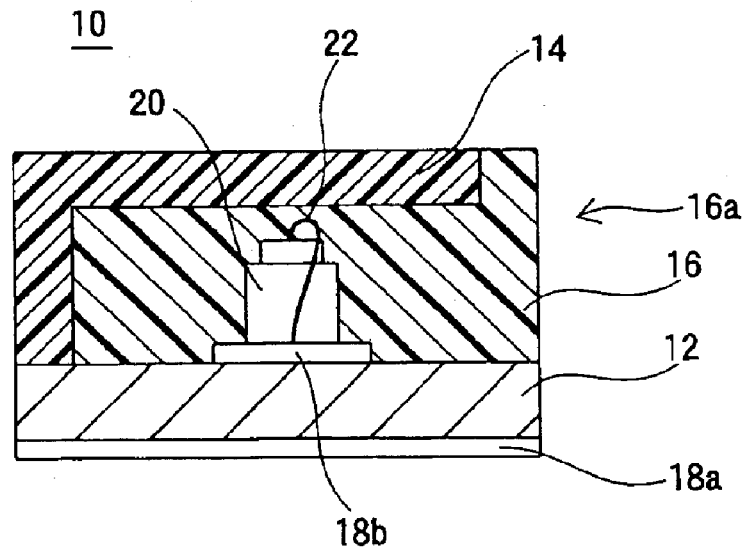
FIG. 2(B) is a cross-sectional view of the light-emitting device at a line IIB—IIB shown in FIG. 1.

It is noted that although each of the electrodes 18a and 18b is shown with a thickness in FIG. 1 and FIGS. 2(A) and 2(B), they are actually formed in a thin-film form. Meanwhile, as shown in FIG. 1, the throughole 12a is covered by the electrode 18a at the front side of the substrate 12, whereby it is possible to prevent the transparent or translucent resin 16 from flowing into the backside of the substrate 12 during molding. Although not shown, the electrode 18b is structured in the same or similar manner.

As can be understood from FIGS. 2(A) and 2(B), the bonding wire 22 is bonded in a direction approximately parallel to a width direction W of the light-emitting device 10. Meanwhile, light-emitting surfaces are surfaces 16a, 16b and a surface opposite to the surface 16b, and are formed of the transparent or translucent resin 16. Furthermore, the light-emitting surfaces are perpendicular to the substrate 12, and each of which is formed by a roughened surface. Due to this, a light outputted from the LED chip 20 and a light reflected by the case 14 are scattered by the light-emitting surfaces. In other words, a light-emitting area is substantially enlarged, and a light-emitting intensity is improved.

Figure 3A:
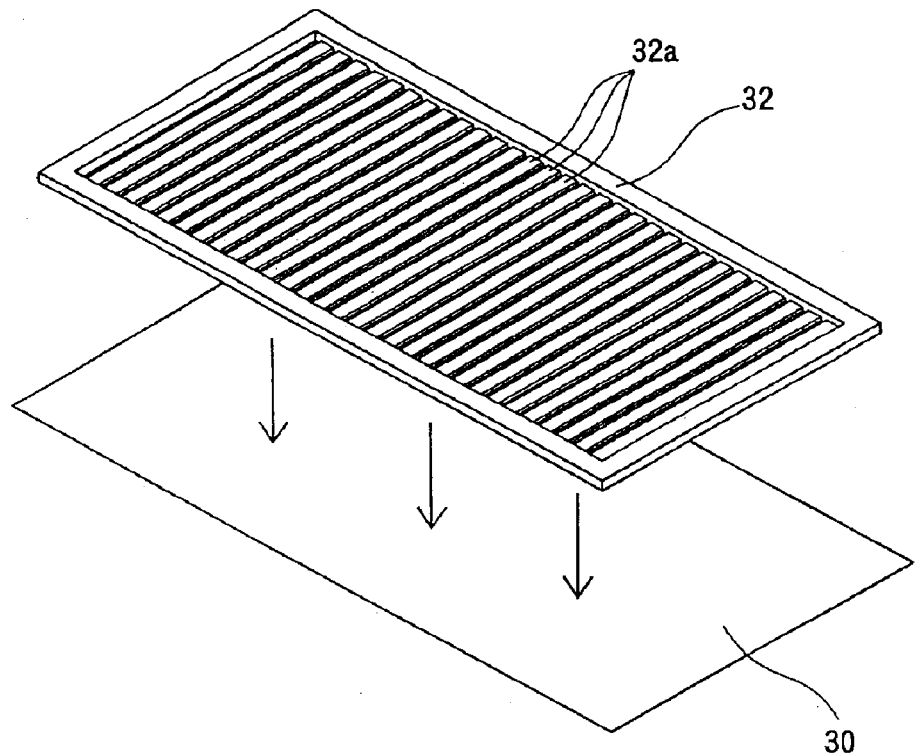
FIG. 3(A) is an illustrative view showing a successive substrate and successive case used for manufacturing the light-emitting device shown in FIG. 1.

Referring to FIG. 3(A), a successive substrate 30 is a substrate which is formed with a plurality of substrates 12 successively, and a successive case 32 is a case which is formed with a plurality of cases 14 successively. These successive substrate 30 and successive case 32 are utilized to manufacture the light-emitting device 10. The successive substrate 30 is, although not shown, formed with sets of the electrodes 18a and 18b in correspondence to the number of light-emitting devices 10 (approximately one thousand as in this embodiment) to be manufactured, and is bonded with the LED chips 20 in correspondence to the number of light-emitting devices 10 to be manufactured.

Figure 3B:
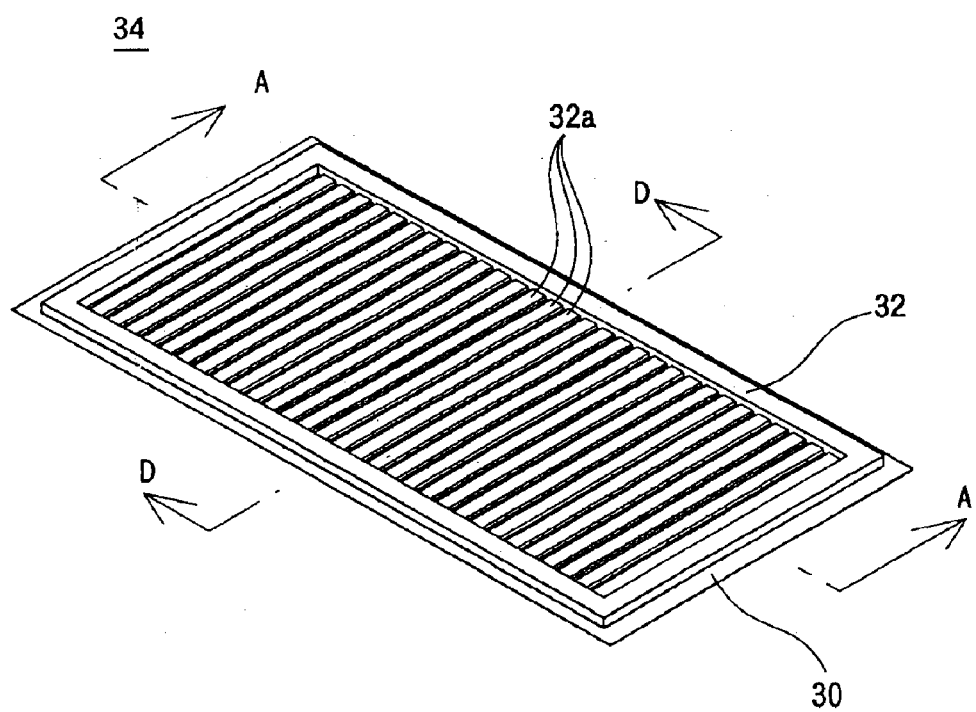
FIG. 3(B) is an illustrative view showing a laminated body in which the successive case adheres to the successive substrate.
Figure 4A:
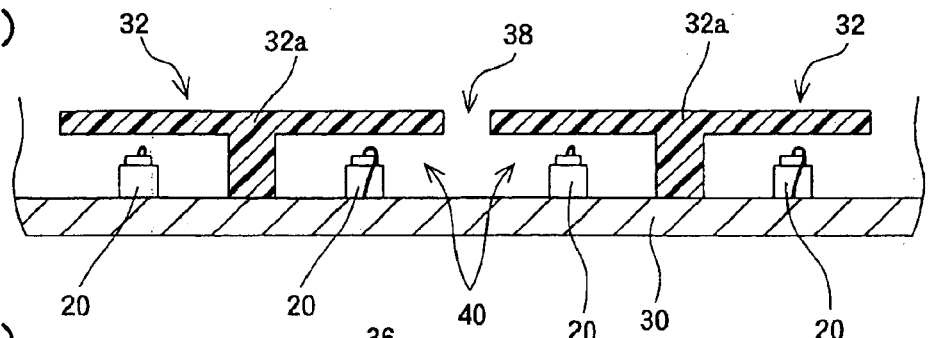
FIG. 4(A) is an illustrative view showing a step to manufacture the laminated body.

The successive case 32 is laminated on the successive substrate 30 as shown in FIG. 3(B), and a laminated body 34 can be thus obtained. As can be understood from FIG. 4(A) of a cross sectional view at a line IVA—IVA in FIG. 3(B), a cross section of a member 32a included in the successive case 32 is formed in a T-character form, and a plurality of members 32a are formed in a lateral direction with predetermined intervals. Meanwhile, the member 32a is formed to be successive in a direction perpendicular to the paper sheet. That is, the member 32a is formed in a stick form so that a cross section is a T-character form. It is noted that as can be understood from FIG. 3(A), respective members 32a are connected at their end portions, whereby a single successive case 32 is formed. Furthermore, the successive case 32 is adhered to the successive substrate 30 at a portion corresponding to a base or bottom of a vertical line of T-character.

When the laminated body 34 is obtained, the successive case 32 is subjected to a UV cleaning. More specifically, an ultraviolet ray is radiated for a predetermined time period (e.g. 3 minutes) in a state that the successive case 32 is adhered to the successive substrate 30. Such the UV cleaning can remove organic matter adhered to a surface of the successive case 32 (case 14), and can improve adhesion between the case 14 and the transparent or translucent resin 16. In other words, a bonded state between the organic matter and the case 14 is released, and it makes easy to connect or combine the transparent or translucent resin 16 injected and the case 14. After finishing the UV cleaning, the transparent or translucent resin 16 is injected into a portion (opposed portion) 38 that openings 40 each being formed by the successive substrate 30 and the successive case 32 are opposite to each other.

Figure 4B:
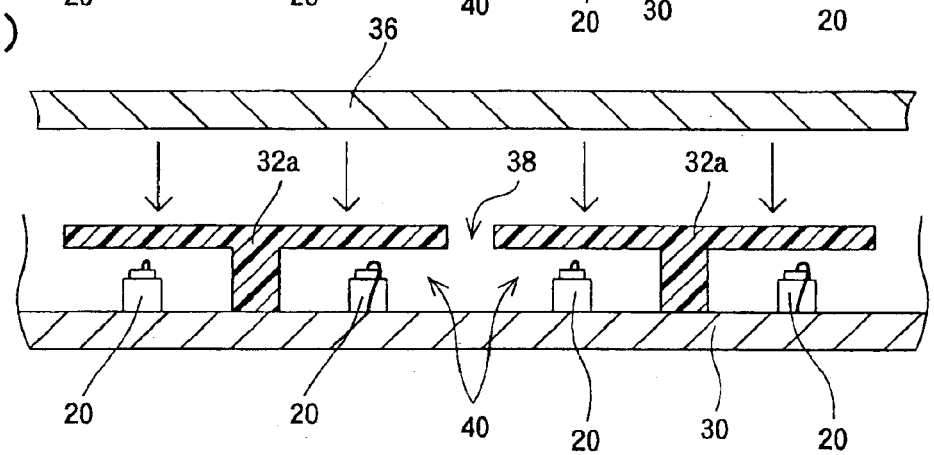
FIG. 4(B) is an illustrative view showing a step to apply a metal mold to the laminated body.
Figure 4C:
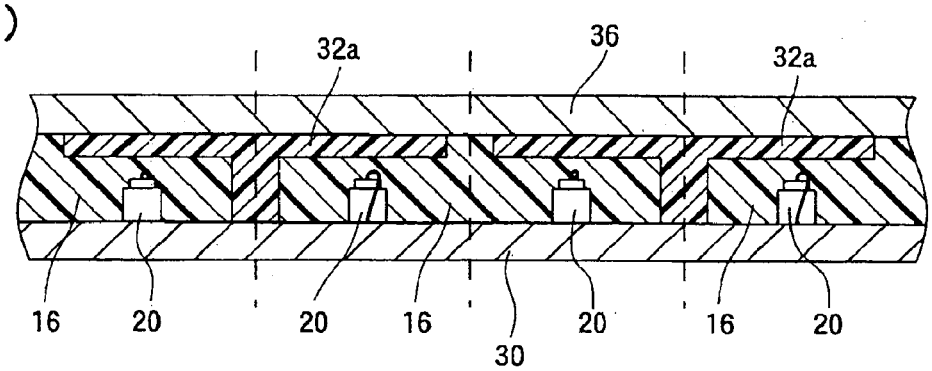
FIG. 4(C) is an illustrative view showing a step to inject a transparent or translucent resin into the laminated body applied with the metal mold.
Figure 4D:
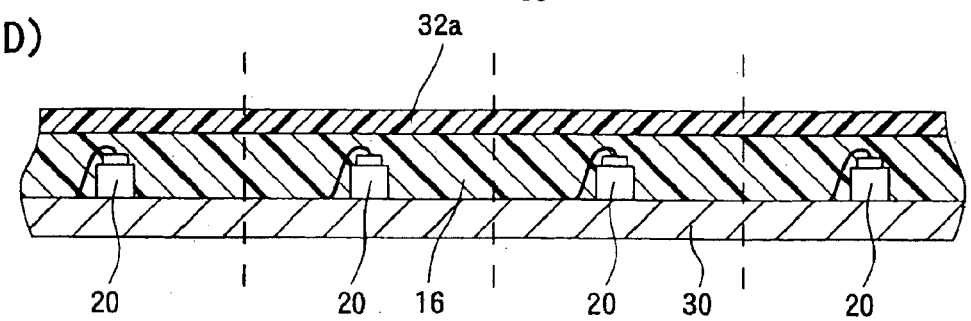
FIG. 4(D) is an illustrative view showing a step to make dicing on the laminated body.

More specifically, a metal mold 36 formed in a flat plate form as shown in FIG. 4(B) is applied or attached to a top surface of the successive case 32, and the transparent or translucent resin 16 is injected into the opposed portion 38 as shown in FIG. 4(C). After finishing the injection, the transparent or translucent resin 16 is hardened, and the metal mold 36 is, in turn, removed from the successive case 32. The laminated body 34 being charged or filled with the transparent or translucent resin 16 is subjected to dicing by a dicing saw (not shown) at a position indicated by a dotted line in FIG. 4(C). As can be understood from FIG. 4(D) of a cross-sectional view at a line IVD—IVD of FIG. 3(B) which illustrates a state the transparent or translucent resin 16 has injected, the laminated body 34 is subjected to dicing every width of the case 14 (light-emitting device 10), whereby the light-emitting device 10 shown in FIG. 1 can be obtained in plural. Since a light-emitting surface of the light-emitting device 10 is formed by dicing, a light-emitting surface is formed with minute concavity and convexity in correspondence to roughness of a blade of the dicing saw. A light outputted from the LED chip 20 is scattered from the light-emitting surface by the minute concavity and the convexity.

According to this embodiment, since a light-emitting surface improved in scattering of light is formed by dicing, it is possible to improve a light-emitting intensity with ease. Accordingly, in a case the light-emitting device is applied to a backlight of an LCD provided on electrical equipment and etc., it is possible to decrease the number of the light-emitting devices. In addition, since the metal mold utilized in injecting the transparent or translucent resin is in a flat plate form, it is easy to manufacture a metal mold.

Figure 5:
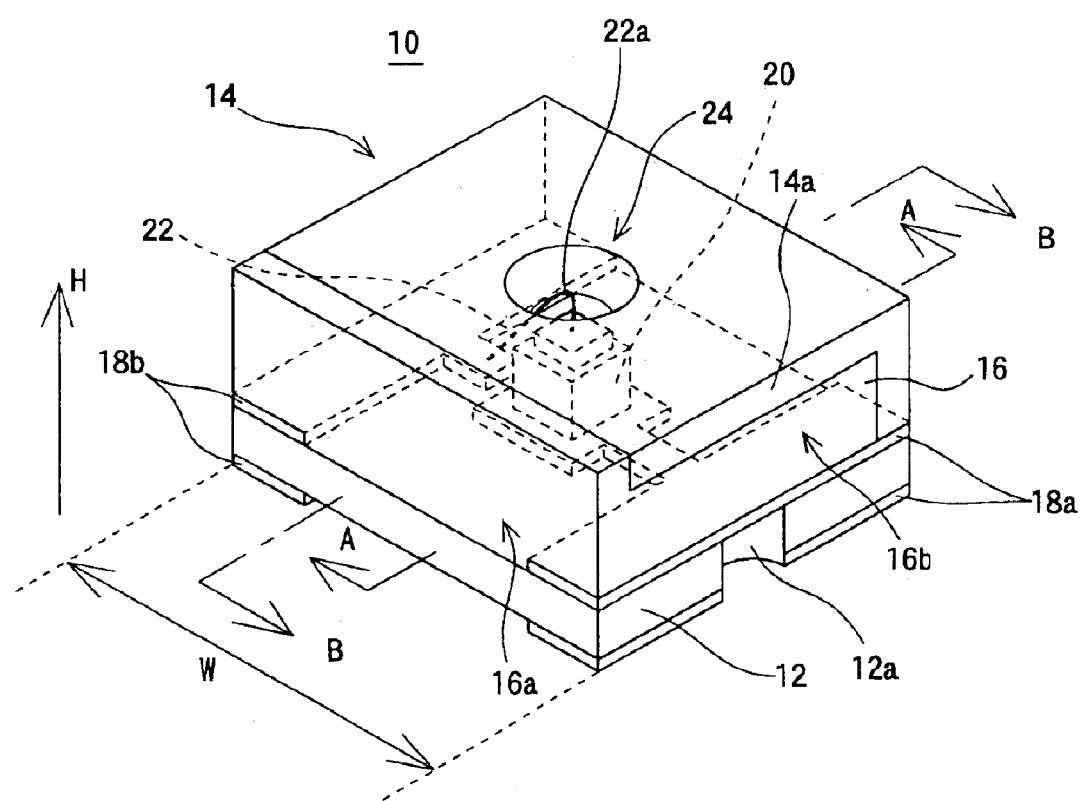
FIG. 5 is an illustrative view showing another embodiment of the present invention.
Figure 6A:
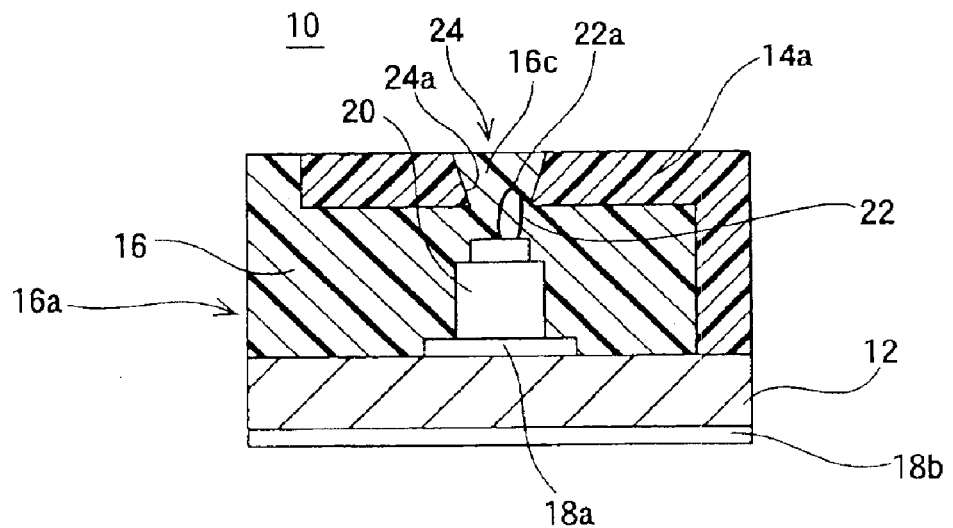
FIG. 6(A) is a cross-sectional view of the light-emitting device at a line VIA—VIA shown in FIG. 5.
Figure 6B:
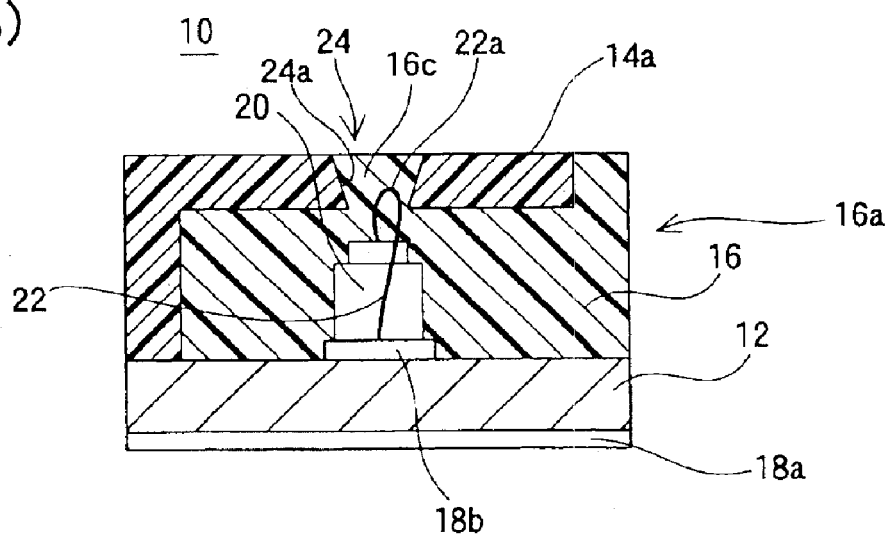
FIG. 6(B) is a cross-sectional view of the light-emitting device at a line VIB—VIB shown in FIG. 5.

Referring to FIG. 5, since a light-emitting device 10 of another embodiment is the same or similar to the device shown by FIGS. 1 to 4 except for that a throughole (hereinafter referred merely to as "hole") 24 is provided on an upper surface of the case 24, a duplicated description will be omitted here as much as possible. As can be understood from FIG. 5 and FIGS. 6(A) and 6(B), the case 14 is formed with the throughole 24 on its top plate 14a. The hole 24 has a shape that a truncated corn is turned upside down, and a diameter thereof becomes larger from a lower surface to an upper surface of the top plate 14a. In addition, the hole 24 is charged or filled with the transparent or translucent resin 16, and the case 14 and the transparent or translucent resin 16 are thus integrated to each other. In other words, the transparent or translucent resin 16 and the case 14 are integrated with each other in such a manner that a convex portion formed on the resin 16 is fitted into a concave portion formed on the case 14 (i.e. hole 24), whereby both of them are integrated to each other.

Figure 7A:
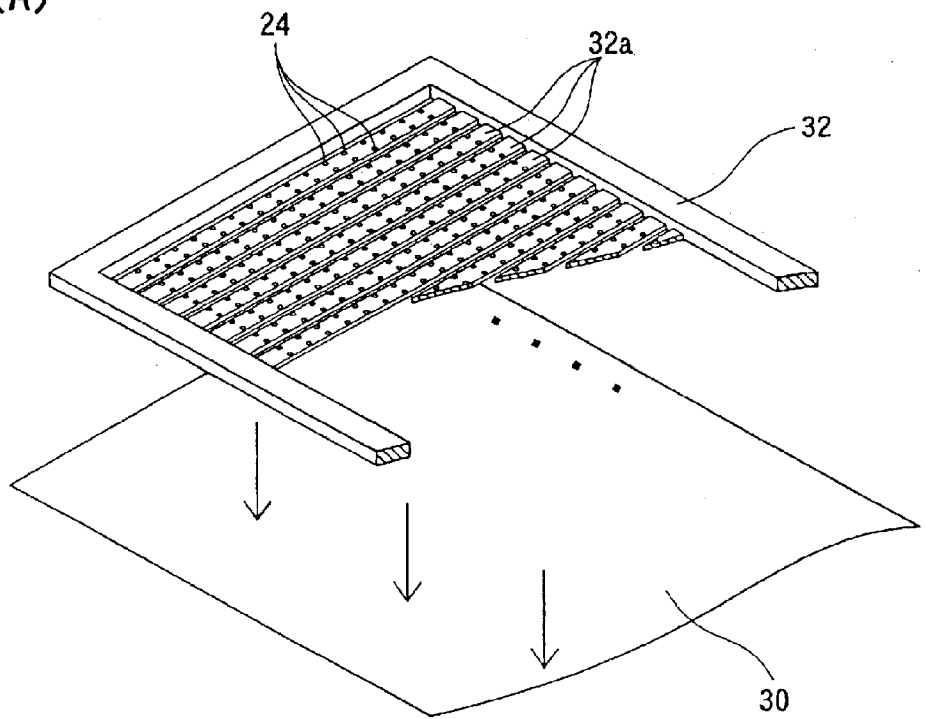
FIG. 7(A) is an illustrative view showing a successive substrate and a successive case used for manufacturing the light-emitting device shown in FIG. 5.
Figure 7B:
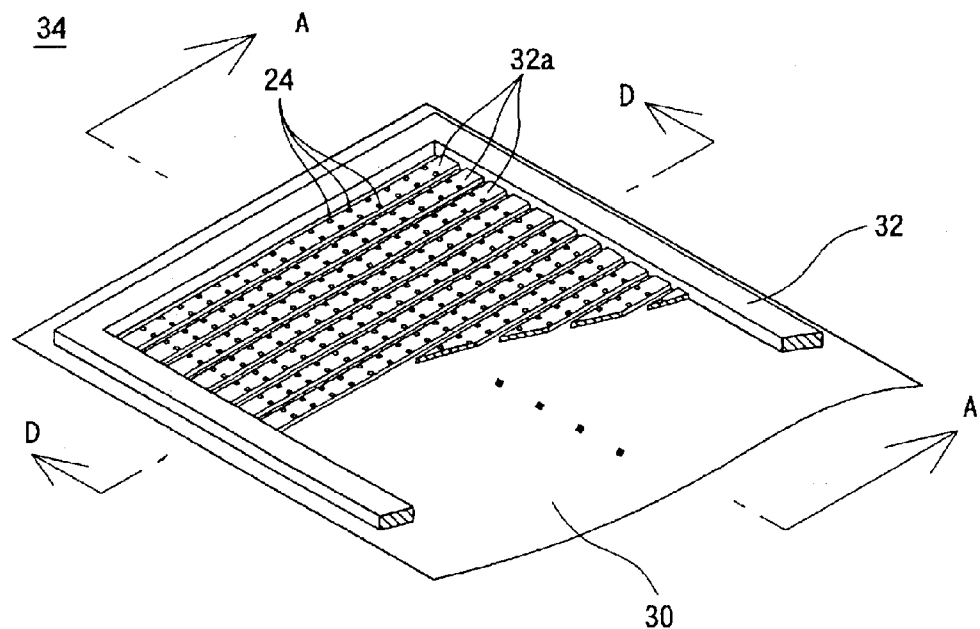
FIG. 7(B) is an illustrative view showing a laminated body in which the successive case adheres to the successive substrate.
Figure 8A:
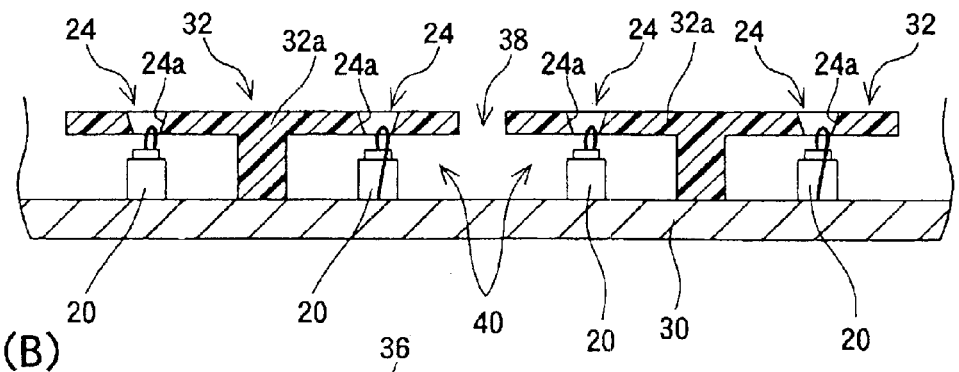
FIG. 8(A) is an illustrative view showing a step to manufacture the laminated body.
Figure 8B:
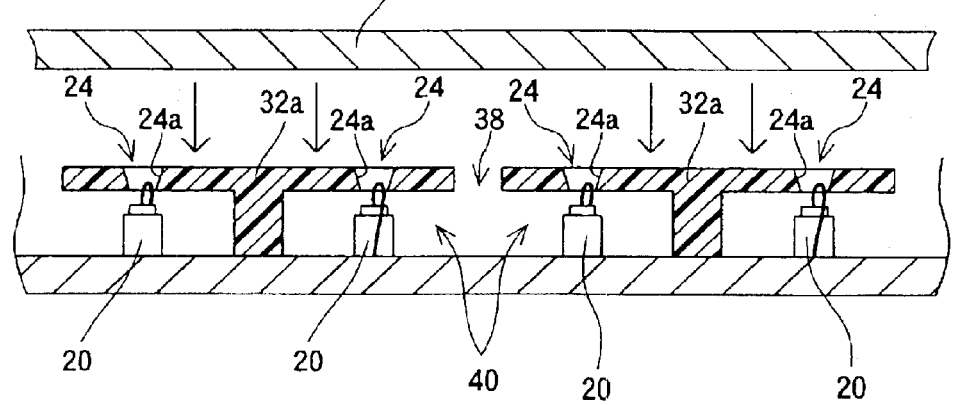
FIG. 8(B) is an illustrative view showing a step to apply a metal mold to the laminated body.
Figure 8C:
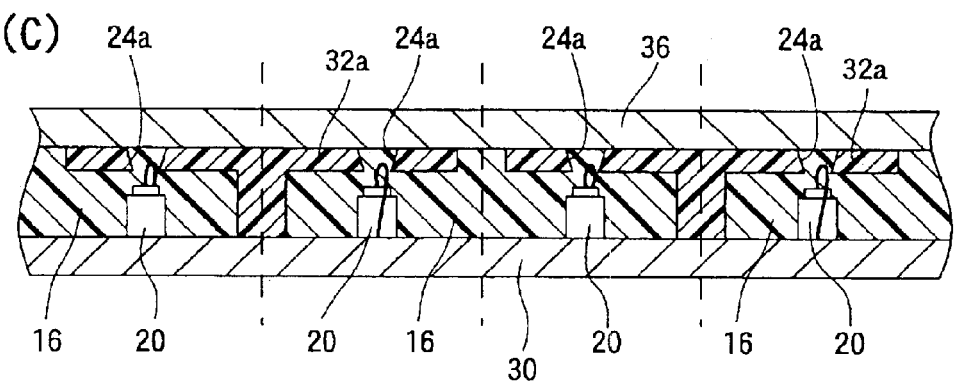
FIG. 8(C) is an illustrative view showing a step to inject a transparent or translucent resin into the laminated body applied with the metal mold.
Figure 8D:
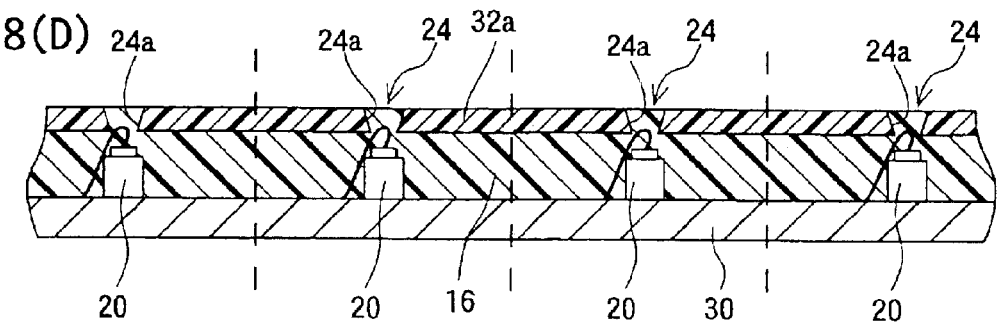
FIG. 8(D) is an illustrative view showing a step to making dicing on the laminated body.

Such the light-emitting device 10 is manufactured in the same or similar manner to the embodiments of FIGS. 1 to 4. Specifically, as shown in FIG. 7(A), a successive case 32 formed with a plurality of holes 24 is laminated on a successive substrate 30, whereby a laminated body 34 shown in FIG. 7(B) is formed. At this time, as can be understood from FIG. 8(A) of a cross-sectional view at a line VIIIA—VIIIA in FIG. 7(B), a top portion of a bonding wire 22 is housed in the hole 24. When the laminated body 34 is obtained after a UV cleaning for a predetermined time, a metal mold 36 is applied to the successive case 32 as shown in FIG. 8(B), and then, a transparent or translucent resin 16 is injected into the successive case 32 as shown in FIG. 8(C). When the resin 16 is hardened, the laminated body 34 is subjected to dicing as shown in FIG. 8(D), and a plurality of light-emitting devices 10 are thus obtained.

According to this embodiment, by forming the hole 24 on the case 14 and by injecting the transparent or translucent resin 16 into the hole 24, the case 14 and the transparent or translucent resin 16 are integrally formed. Due to this, even if a force is applied to the case 14 in the width direction W of the light-emitting device 10 shown in FIG. 5, the convex portion 16c of the transparent or translucent resin 16 functions as a stopper, and detachment of the case 14 is thus prevented. Furthermore, since the diameter of the hole 24 is made larger toward upper direction, even if a force is applied in an upper direction H in FIG. 5, the case 14 is never separated.

In addition, although the diameter of the hole 24 is made larger toward the upper surface of the top plate 14a so that it makes difficult to enter the transparent or translucent resin 16 into the hole 24, because of the improvement in adhesion between the transparent or translucent resin 16 and the case 14 by UV cleaning, the transparent or translucent resin 16 is easily intruded into the hole 24.

Furthermore, since the hole 24 is formed directly above the LED chip 20, a top 22a of the boding wire 22 extending from the upper surface of the chip is housed within the hole 24. Due to this, even if the height of the case 14 is made lower, the bonding wire 22 is never brought into contact with the case 14, and therefore, it is possible to prevent disconnection of the bonding wire 22 when attaching the case 14. In addition, since the light-emitting device 10 can be formed in a thin type (thinner than above-described light-guide plate), the light outputted from the LED chip 20 is efficiently incident on the light-guide plate.

Furthermore, since a light outputted through the hole 24 to outside enables lighting test of the light-emitting device 10, a lighting test apparatus for an upper-emission type semiconductor light-emitting device can be applied to the light-emitting device 10 of this embodiment. In other words, there is no need to provide another test apparatus, and there is no need to change positions of optical sensors provided on the test apparatus. In the lighting test, an amount of the light-emission from the light-emitting surface (side surfaces) may be evaluated by multiplying a ratio of an area of the light-emitting surface and an area of the hole 24 by an amount of the light-emission from the hole 24.

Figure 9:
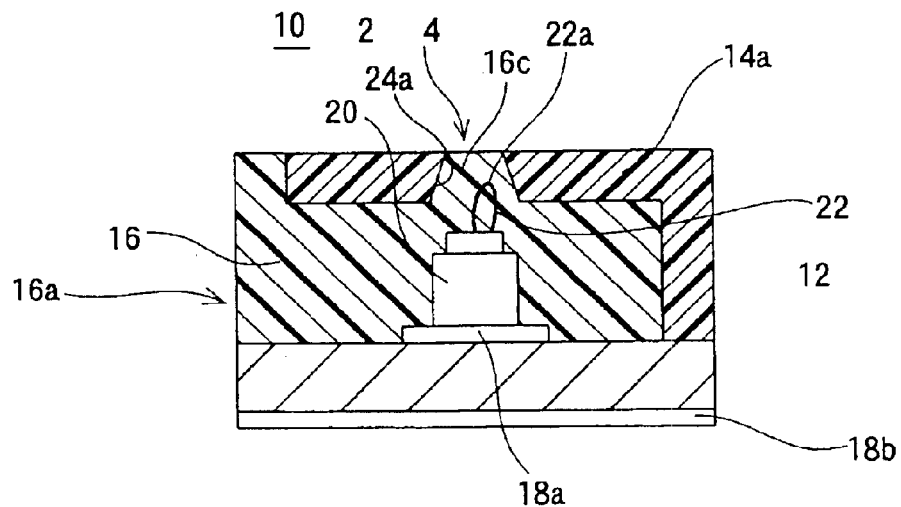
FIG. 9 is a cross-sectional view showing a modified example of the light-emitting device shown in FIG. 5.

It is noted that in this embodiment the hole is formed in a shape that a truncated corn is turned upside down, but such a hole may formed in a shape that a truncated corn is put upside up, i.e. in upward direction as shown in FIG. 9. In other words, a diameter of the hole may be made smaller toward the upper direction. In a case a hole has a form shown in FIG. 5 embodiment, when a large force is applied in the upper direction H, a convex portion of a transparent or translucent resin is broken, and therefore, there is a fear disconnection of a wire might occur. In contrast, when a hole is formed to become smaller toward the upper direction, even if a case is separated by a large force in the upper direction, the disconnection of a bonding wire can be avoided.

Furthermore, if it is required only the adhesion between the case and the transparent or translucent resin is improved, the hole may be formed in a cylindrical form. However, when detaching the metal mold for forming the case, since friction of a portion brought into contact with the hole becomes larger, it is difficult to pull out the metal mold, and there is a fear that the successive case might be damaged. Accordingly, in this embodiment, a hole of tapered form that a diameter becomes larger toward the upper direction is formed in order to solve these problems.

In addition, in this embodiment, although the UV cleaning is made on the case (successive case), plasma cleaning and sputtering cleaning may be used to remove the organic matter; however, in the examination performed by the inventor, the UV cleaning made adhesion best, and in addition, the plasma cleaning and the sputtering cleaning have a problem that a vacuum system is needed, and thus the cleaning apparatus itself is expensive.

Furthermore, although a whole surface of the case (successive case) including an inner surface is cleaned in this embodiment, if at least the inner surface of the hole is cleaned, it is possible to enter or intrude the transparent or translucent resin into the hole.

Figure 10:
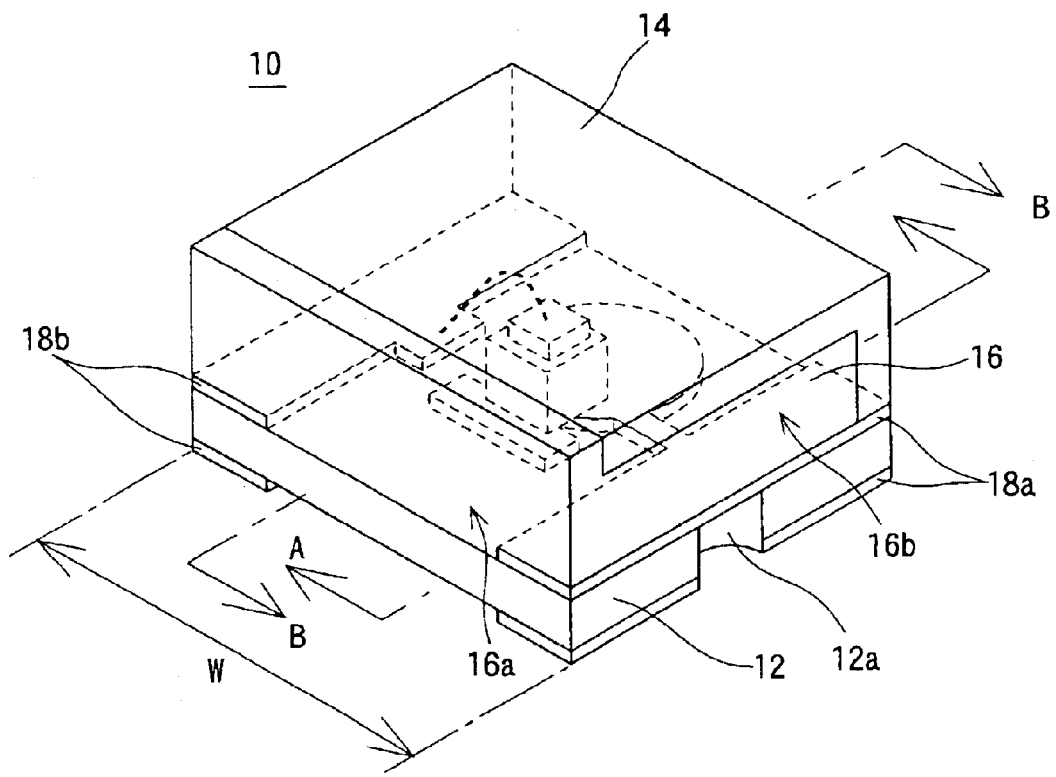
FIG. 10 is an illustrative view showing another embodiment of the present invention.
Figure 11A:
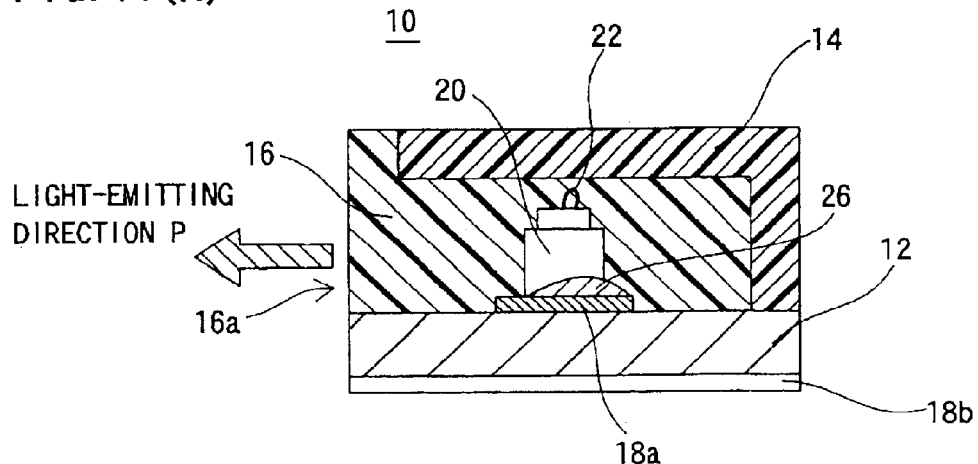
FIG. 11(A) is a cross-sectional view of the light-emitting device at a line XA—XA shown in FIG. 10.
Figure 11B:
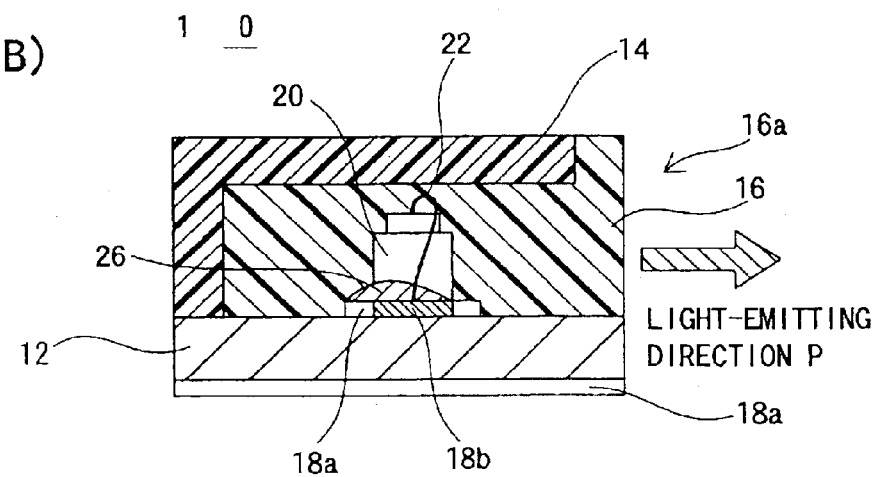
FIG. 11(B) is a cross-sectional view of the light-emitting device at a line XB—XB shown in FIG. 10.
Figure 13A:
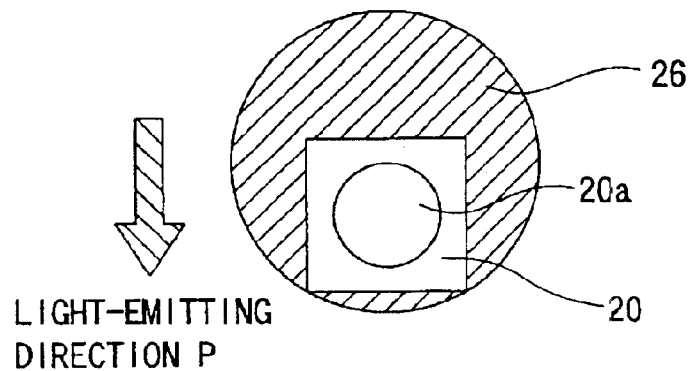
FIG. 13(A) is an illustrative view when the LED chip and a DB paste bonded onto an electrode are viewed from the upper side.
Figure 13B:
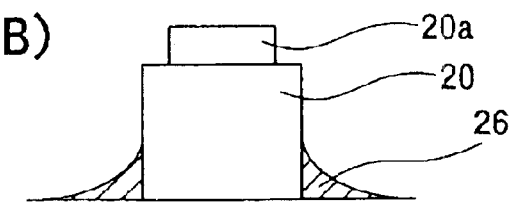
FIG. 13(B) is an illustrative view when the LED chip and the DB paste bonded onto the electrode are viewed from a light-emitting surface (front side)
Figure 13C:
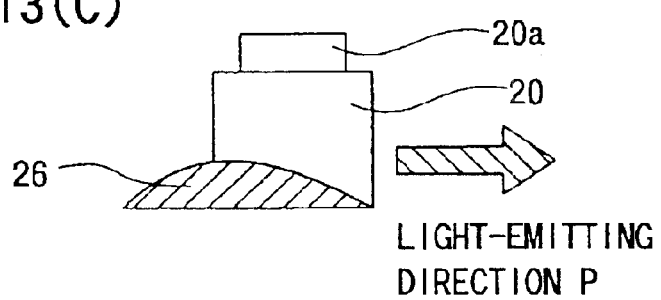
FIG. 13(C) is an illustrative view when the LED chip and the DB paste bonded onto the electrode are viewed from the side surface.
Figure 13D:
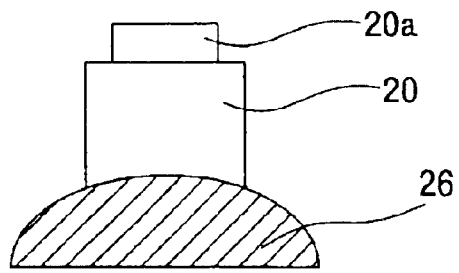
FIG. 13(D) is an illustrative view when the LED chip and the DB paste bonded onto the electrode are viewed from an opposite side (back surface) of the light-emitting surface.
Figure 14A:
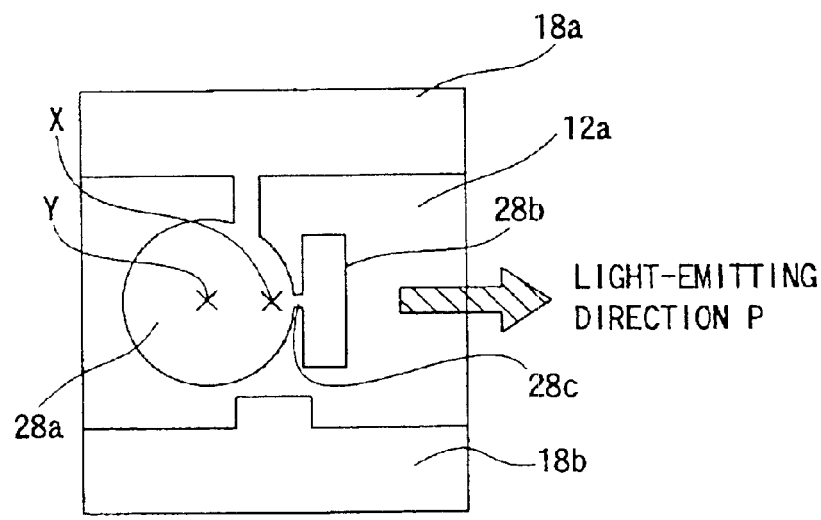
FIG. 14(A) is an illustrative view showing one example of the electrode formed on the substrate.

Referring to FIG. 10, since a light-emitting device 10 of another embodiment is the same or similar to that of FIGS. 1 to 4 except that an electrode 18a is formed as shown in FIG. 14(A), a duplicate description will be omitted as much as possible. It is noted since in this embodiment a relative position between a DB paste and an LED chip has a special significance, and therefore, a DB paste is particularly illustrated by giving a reference numeral "26". The DB paste 26 is illustrated by utilizing slant lines in FIG. 11(A), FIG. 11(B), FIG. 12, and FIGS. 13(A) to 13(D), but it is noted that the slant lines never show a cross-section.

Figure 12:
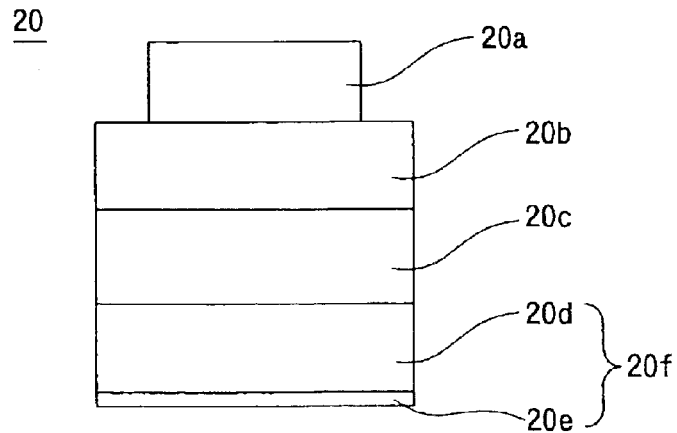
FIG. 12 is an illustrative view showing an LED chip shown in FIG. 11.

As shown in FIG. 12, the LED chip 20 includes a p-type electrode (bonding pad) 20a to be connected to the bonding wire 22 and an n-type electrode 20e to be connected to the electrode 18a. The n-type electrode 20e is formed by a thin film similarly to the electrodes 18a and 18b. The LED chip 20 includes a p layer 20b, a light-emitting layer 20c and an n layer 20d which are laminated on the n-type electrode 20e in an order of the n layer 20d, the light-emitting layer 20c and the p layer 20b. Each of the p layer 20b and the n layer 20d is formed of a translucent or transparent semiconductor GaAs. Furthermore, the n-type electrode 20e is formed of a copper thin film or the like having reflectivity. Due to this, a light emitted from the light-emitting layer 20c is outputted to an outside of the LED chip 20 through the p layer 20b and the n layer 20d. Furthermore, a light emitted below the light-emitting device 20c is reflected from a surface of the n-type electrode 20e and outputted to the outside of the LED chip 20 via the n layer 20d.

Accordingly, in a case the LED chip 20 is die-bonded onto the electrode 18a by the DB paste 26, a base 20f including the n layer 20d and the n-type electrode 20e is covered with the DB paste 26, and the light outputted through the n layer 20d is thus blocked by the DB paste 26. For avoiding this, in this embodiment by die-bonding the LED chip 20 onto the position shown in FIGS. 13(A) to 13(D), a light in a light-emitting direction P can be utilized at maximum.

In other words, as shown in FIG. 13(A), the LED chip 20 is die-bonded onto the electrode 18a in a state that it is deviated from a center of the DB paste 26 to the downward direction (light-emitting direction P). Accordingly, when viewing the LED chip 20 from the side of the light-emitting surface 16a, a portion covered by the DB paste 26 is decreased at the light-emitting direction P side of the LED chip 20. Meanwhile, when viewing the LED chip 20 from a side opposing to the surface 16b, as shown in FIG. 13(C), an amount of the DB paste 26 is continuously decreased from the center of the DB paste 26 toward the light-emitting direction P. Furthermore, when viewing the LED chip 20 from a side opposing to the surface 16a, as shown in FIG. 13(D), the base 20f of the LED chip 20 is covered with the DB paste 26. This is because the surface opposing to the light-emitting surface 16a is closer to the center of the DB paste 26, and the DB paste 26 increases in amount.

In this manner, since the LED chip 20 is mounted in a state that it is deviated from the center of the DB paste 26 to the light-emitting surface 16a side, the electrode 18a shown in FIG. 14(A) is formed. According to FIG. 14(A), the electrode 18a includes an application area 28a to which the DB paste 26 is to be applied and an auxiliary area 28b. The application area 28a is circular in shape, and a center Y is deviated from a center X of the substrate 12 toward the left (direction opposite to the light-emitting direction P). Meanwhile, the auxiliary area 28b is vertically-long rectangular in shape and formed at a right side (light-emitting direction P) of the application area 28a. Furthermore, the application area 28a and the auxiliary area 28b are connected to each other with a narrow connecting portion 28c.

Figure 14B:
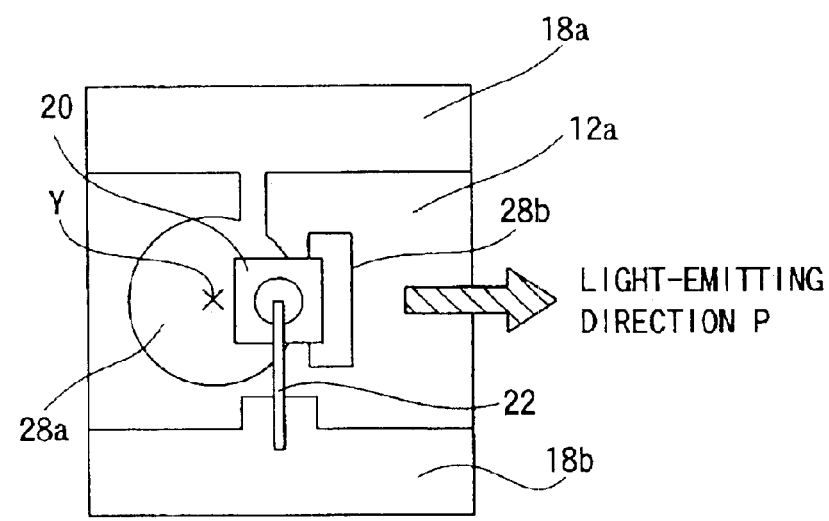
FIG. 14(B) is an illustrative view showing a state that the LED chip is mounted on the electrode.

When the DB paste 26 is dropped on the center Y of the application area 28a, the DB paste 26 spreads in approximately circular. As shown in FIG. 14(B), the LED chip 20 is mounted on the center X of the substrate 12. Due to this, a surface at a side of the light-emitting surface 16a of the LED chip 20 is never covered with the DB paste 26, and it is possible to prevent the light outputted to the light-emitting direction P from being blocked by the DB paste 26. Furthermore, by providing the auxiliary area 28b, it is possible to reliably connect the LED chip 20 to the electrode 18a. It is noted that in FIGS. 14(A) and 14(B), illustration of the DB paste 26 will be omitted to simply show the electrode 18.

A size of the application area 28a depends on an application amount and viscosity of the DB paste 26, and as the size of the application area 28a is determined, the position (center Y) of the application area 28a is also determined. Since the application area 28a and the auxiliary area 28b are connected (jointed) by the connecting portion 28c, it is possible to prevent the DB paste 26 from entering the auxiliary area 28b. That is, it is possible to decrease the amount of the DB paste 26 at the side of the light-emitting surface 16a.

Figure 15A:
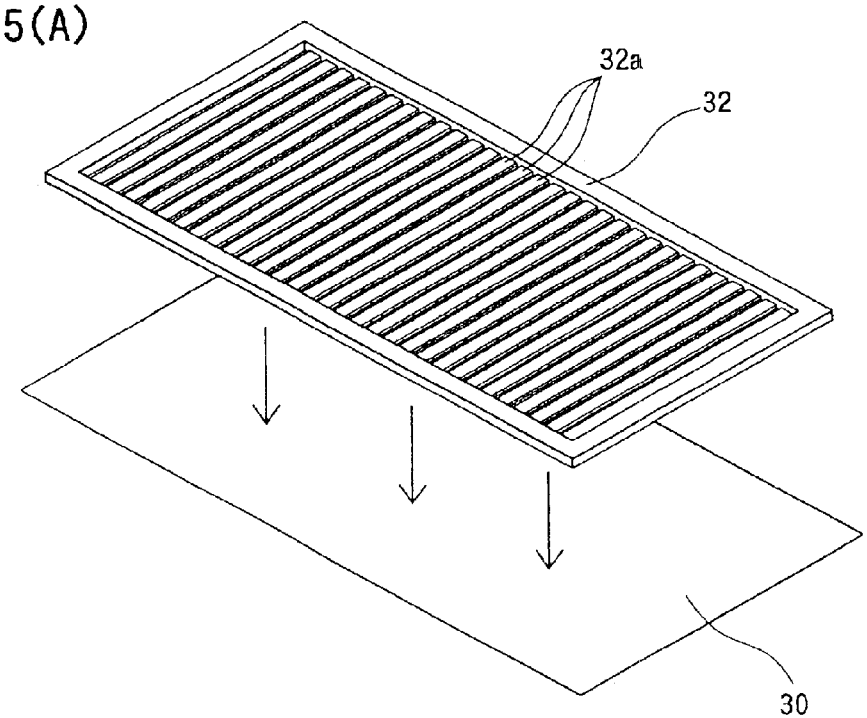
FIG. 15(A) is an illustrative view showing a successive substrate and a successive case utilized in the light-emitting device shown in FIG. 10.
Figure 15B:
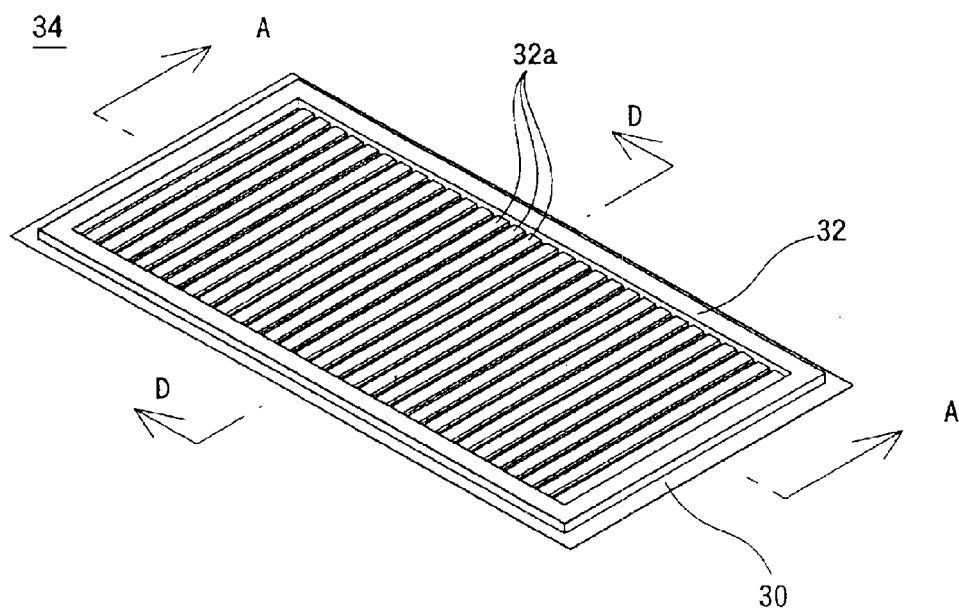
FIG. 15(B) is an illustrative view showing a laminated body in which the successive case adheres to the successive substrate.
Figure 16A:
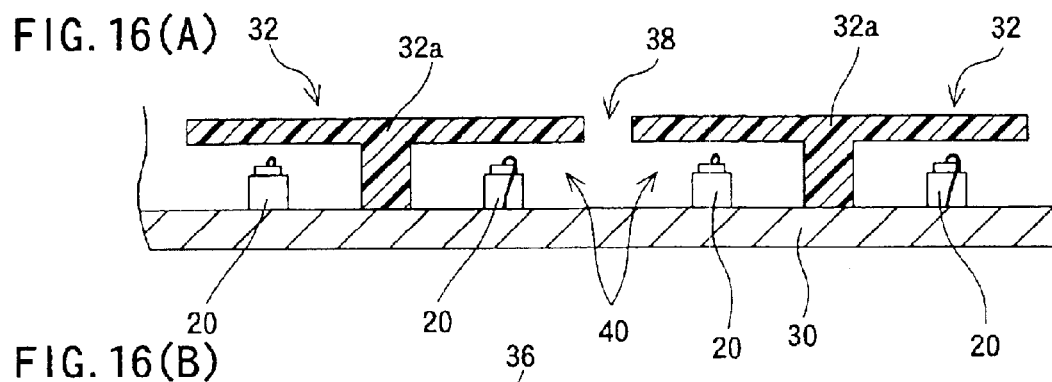
FIG. 16(A) is an illustrative view showing a step to manufacture the laminated body.
Figure 16B:
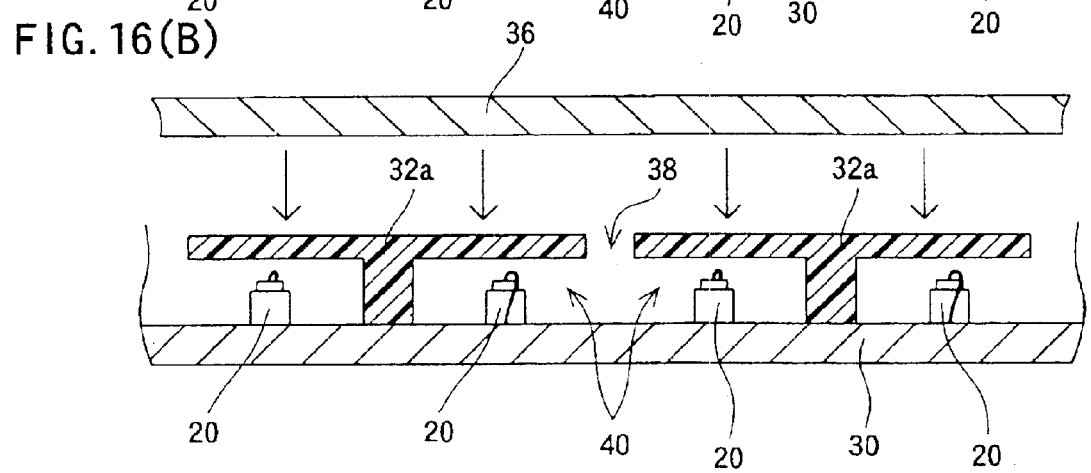
FIG. 16(B) is an illustrative view showing a step to apply a metal mold to the laminated body.
Figure 16C:
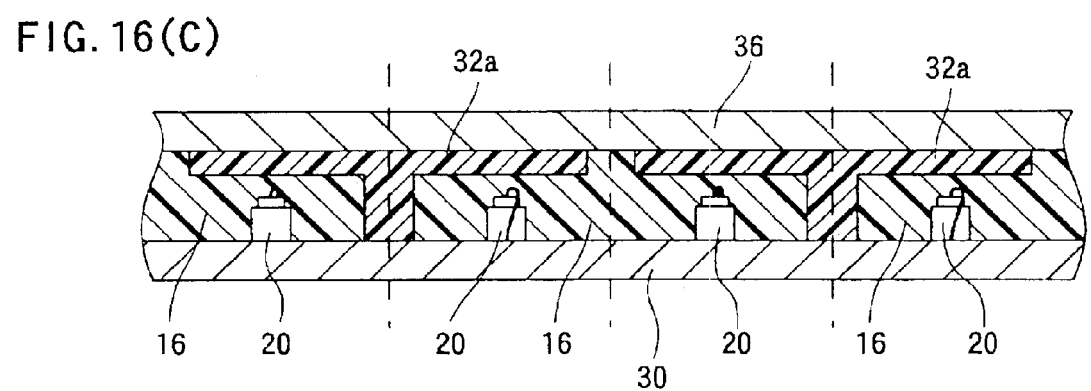
FIG. 16(C) is an illustrative view showing a step to inject a transparent or translucent resin into the laminated body applied with the metal mold.
Figure 16D:
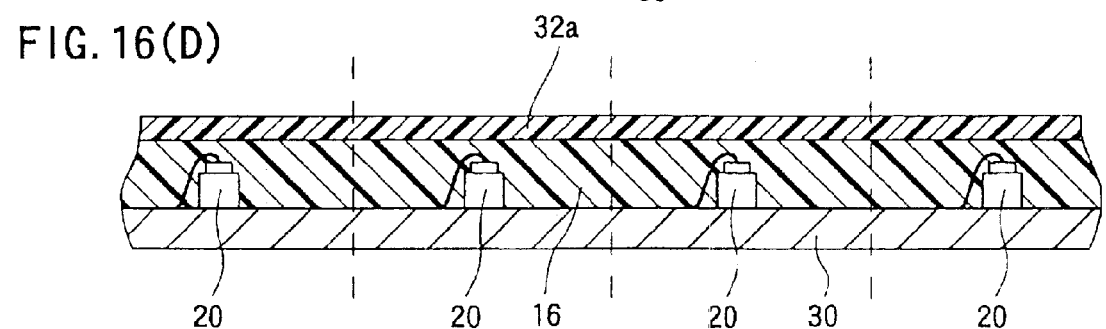
FIG. 16(D) is an illustrative view showing a step to make dicing on the laminated body.
Figure 17A:
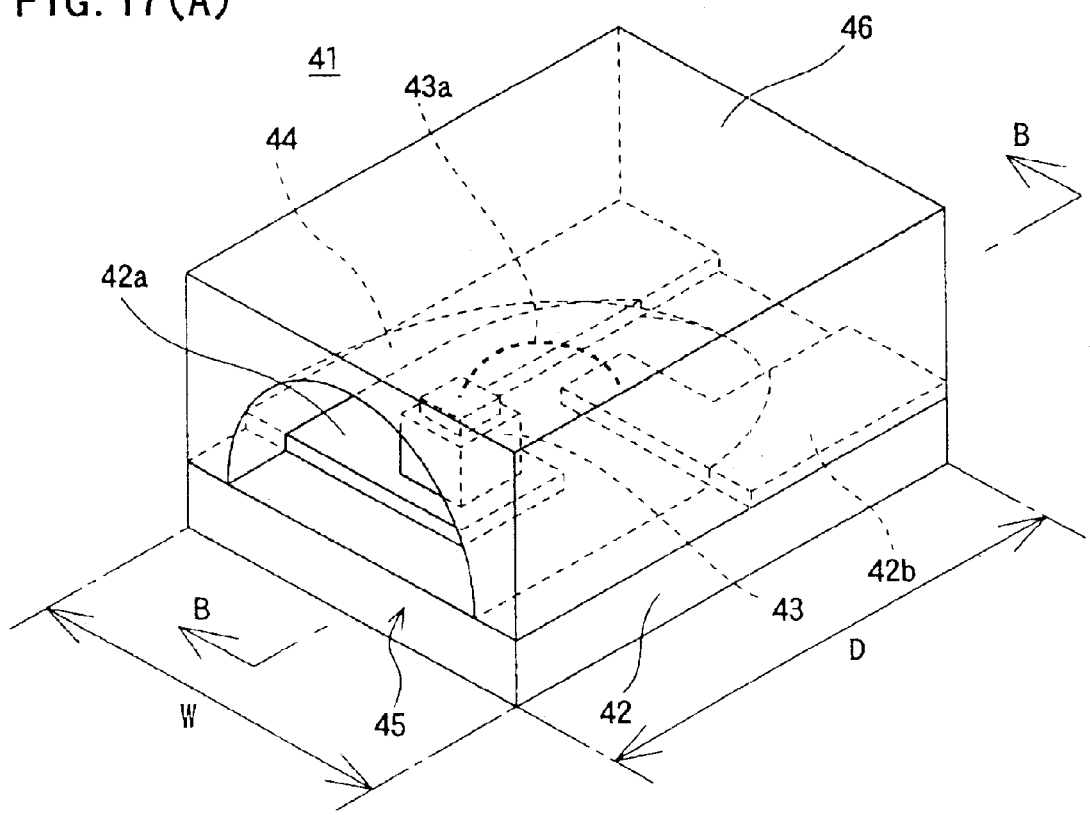
FIG. 17(A) is an illustrative view showing one example of a conventional side-emission type semiconductor light-emitting device.
Figure 17B:
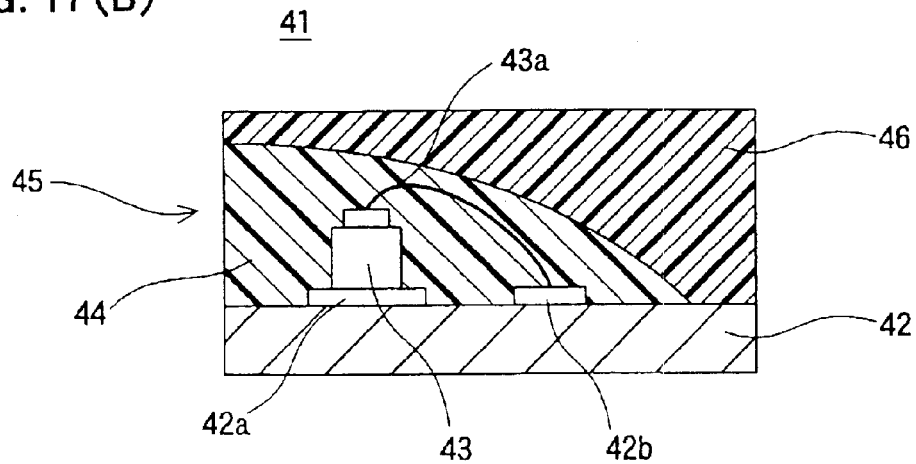
FIG. 17(B) is a cross-sectional view of the side-emission type semiconductor light-emitting device at a line XVIB—XVIB shown in FIG. 17(A)
Figure 18A:
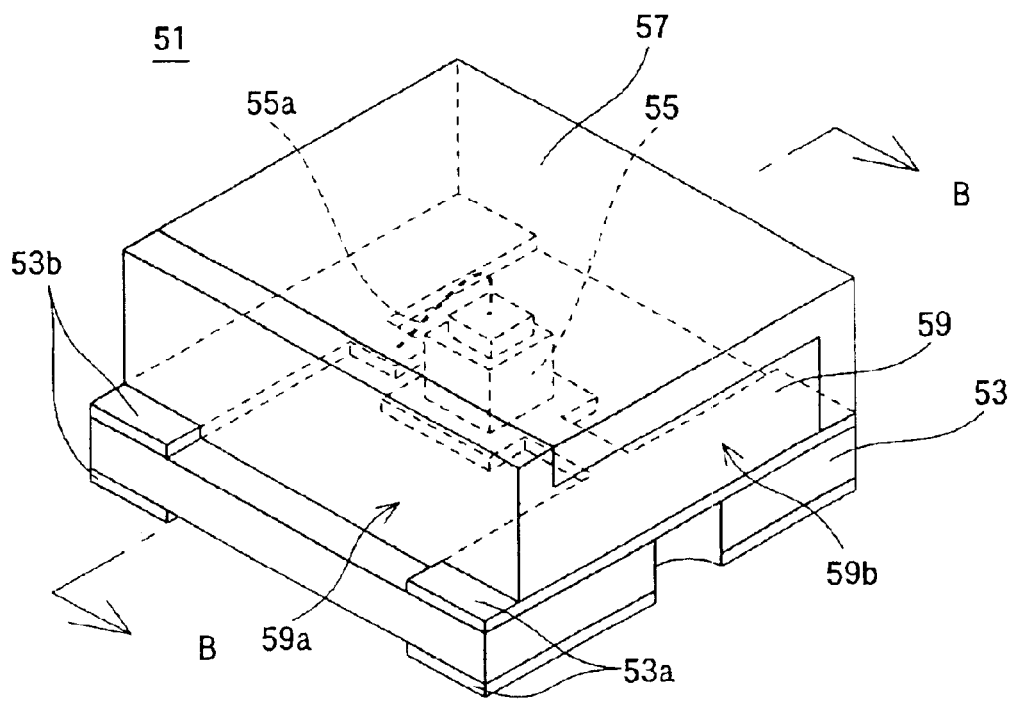
FIG. 18(A) is an illustrative view showing one example of a side-emission type semiconductor light-emitting device as a background art of the present invention.
Figure 18B:
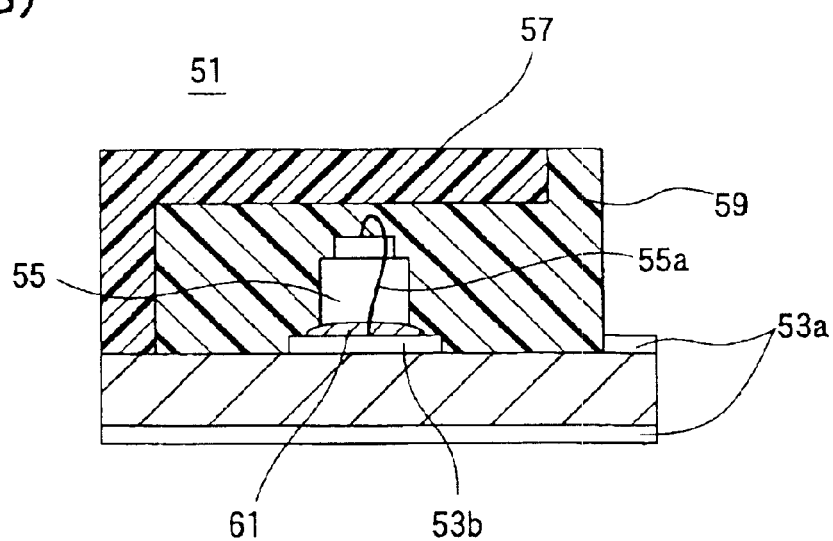
FIG. 18(B) is a cross-sectional view of the side-emission type semiconductor light-emitting device at the line XVIIB—XVIIB shown in FIG. 18(A)
Figure 19A:
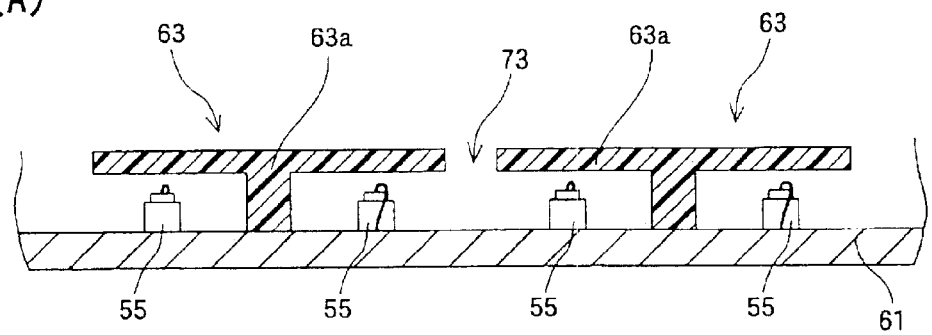
FIG. 19(A) is an illustrative view showing a step to bond a successive case to a successive substrate when manufacturing the side-emission type semiconductor light-emitting device shown in FIG. 18(A)
Figure 19B:
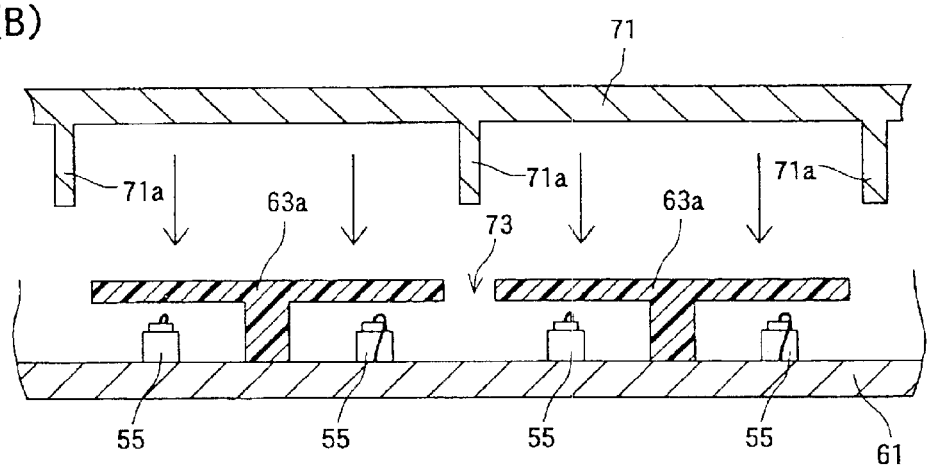
FIG. 19(B) is an illustrative view showing a step to apply a metal mold to the successive case bonded to the successive substrate.
Figure 19C:
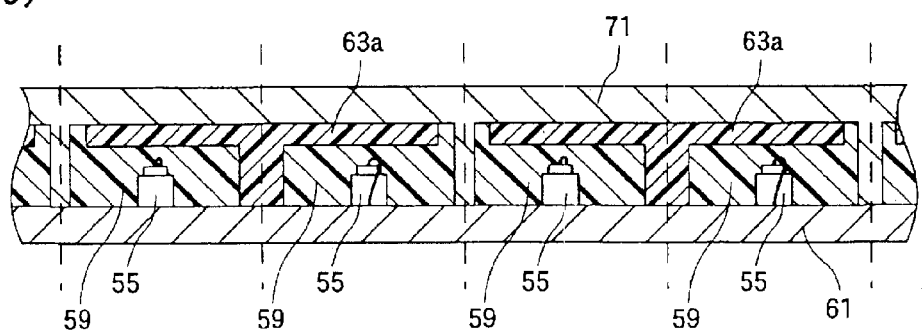
FIG. 19(C) is an illustrative view showing a step to inject a transparent or translucent resin into the successive case applied with the metal mold.

Such the light-emitting device 10 is manufactured in the same or similar manner to the embodiment of FIGS. 1 to 4. That is, as shown in FIG. 15(A), the successive case 32 is laminated on the successive substrate 30, and the laminated body 34 shown in FIGS. 15(B) and 16(A) is, in turn, formed. When the laminated body 34 is formed, after UV cleaning for a predetermined time period, the metal mold 36 is applied to the successive case 32 as shown in FIG. 16(B), and the transparent or translucent resin 16 is injected into the successive case 32 as shown in FIG. 16(C). When the transparent or translucent resin 16!is hardened, the laminated body 34 is subjected to dicing at a portion shown by a dotted line in FIG. 16(D), and a plurality of light-emitting devices 10 are thus obtained.

According to this embodiment, since the mounted position of the LED chip 20 is deviated from the center Y of the DB paste 26 to the light-emitting surface 16a side, the light-emitting side of the LED chip 20 is never covered with the DB paste 26. In other words, because a light outputted to a desired direction is never blocked by the DB paste, it is possible to improve a light-emitting efficiency.

It is noted that an electrode is not limited to the shape shown in FIG. 14(A), and it is appropriate that a shape can determine an application position of the DB paste uniquely. Furthermore, if an electrode is formed as in FIG. 14(A) and an application position of a DB paste is changed, it is possible to manufacture the light-emitting device of this embodiment utilizing a conventional manufacturing device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A side-emission type semiconductor light-emitting device, comprising:

a substrate formed with an electrode;

an LED chip bonded onto said substrate;

a transparent or translucent resin with which said LED chip is molded; and a reflector which reflects a light emitted from said LED chip, wherein said transparent or translucent resin has a convex portion, and said reflector has a throughole to be fitted into said convex portion.

2. A side-emission type semiconductor light-emitting device comprising:

a substrate formed with an electrode;

an LED chip bonded onto said substrate;

a transparent or translucent resin with which said LED chin is molded; and a reflector which reflects a light emitted from said LED chip, wherein said transparent or translucent resin has a convex portion, and said reflector has a concave portion to be fitted into said convex portion, and wherein said concave portion is a throughole having a diameter which becomes larger from one main surface to other main surface of said reflector.

3. A side-emission type semiconductor light-emitting device according to claim 2, wherein said one main surface is a surface brought into contact with said transparent or translucent resin, and said other main surface is a surface exposed to outside.

4. A side-emission type semiconductor light-emitting device according to claim 1, wherein said LED chip has a bonding wire extending from a top surface, and said throughole is formed directly above said LED chip.

5. A side-emission type semiconductor light-emitting device according to claim 2, wherein said LED chip has a bonding wire extending from a top surface, and said concave portion is formed directly above said LED chip.

6. A side-emission type semiconductor light-emitting device according to claim 3, wherein said LED chip has a bonding wire extending from a top surface, and said concave portion is formed directly above said LED chip.

* * * * *